(12) United States Patent
Hatamian

(10) Patent No.: US 6,661,727 B2
(45) Date of Patent: *Dec. 9, 2003

(54) DYNAMIC REGISTER WITH LOW CLOCK RATE TESTING CAPABILITY

(75) Inventor: Mehdi Hatamian, Mission Viejo, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/252,491

(22) Filed: Sep. 23, 2002

(65) Prior Publication Data

US 2003/0016582 A1 Jan. 23, 2003

Related U.S. Application Data

(63) Continuation of application No. 09/775,243, filed on Feb. 1, 2001, now Pat. No. 6,456,552, which is a continuation of application No. 09/437,723, filed on Nov. 9, 1999, now Pat. No. 6,212,119.

(60) Provisional application No. 60/130,616, filed on Apr. 22, 1999, provisional application No. 60/108,319, filed on Nov. 13, 1998, and provisional application No. 60/107,878, filed on Nov. 9, 1998.

(51) Int. Cl.[7] .............................................. G11C 7/00
(52) U.S. Cl. ........................ 365/222; 365/239; 365/240
(58) Field of Search ................................ 365/222, 239, 365/240, 189.12

(56) References Cited

U.S. PATENT DOCUMENTS

| | | | | | |
|---|---|---|---|---|---|
| 4,390,987 A | * | 6/1983 | Best | ............................ | 328/191 |
| 4,495,629 A | * | 1/1985 | Zasio et al. | .................... | 377/70 |
| 5,159,616 A | * | 10/1992 | Douglas et al. | ................ | 377/70 |

* cited by examiner

*Primary Examiner*—Vu A. Le
(74) *Attorney, Agent, or Firm*—McAndrews, Held & Malloy, Ltd.

(57) ABSTRACT

A method for refreshing data in a circuit element included in a dynamic register. A static loop is coupled to the circuit element as a feedback path from the output terminal to the input terminal of the circuit element. A control signal is provided to the static loop. The static loop is activated via the control signal to refresh the data in the circuit element.

23 Claims, 5 Drawing Sheets

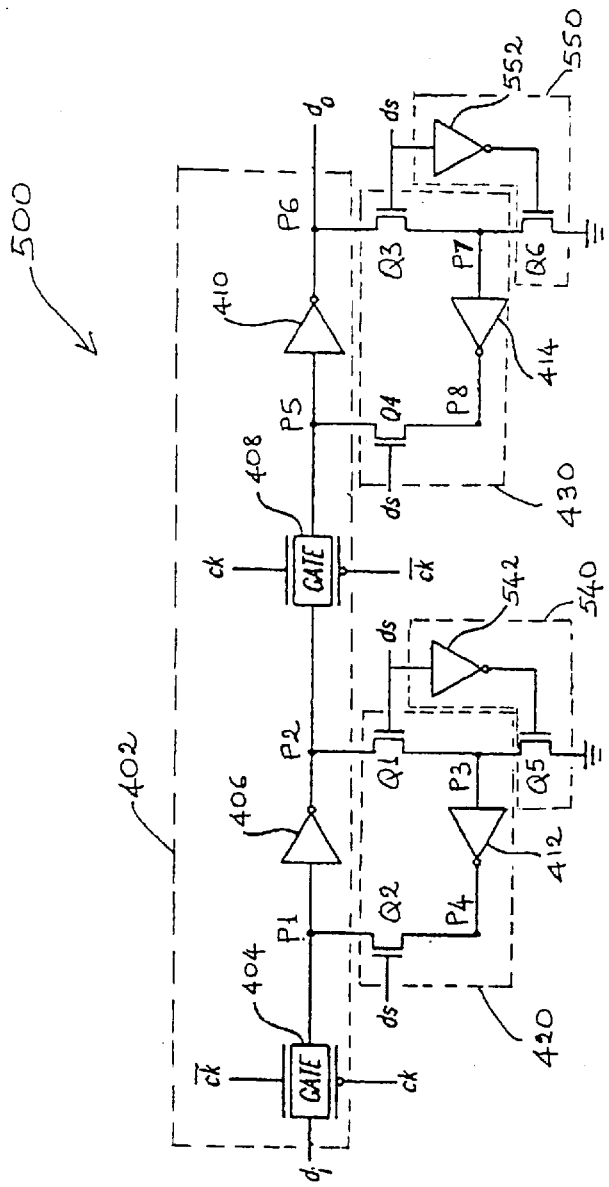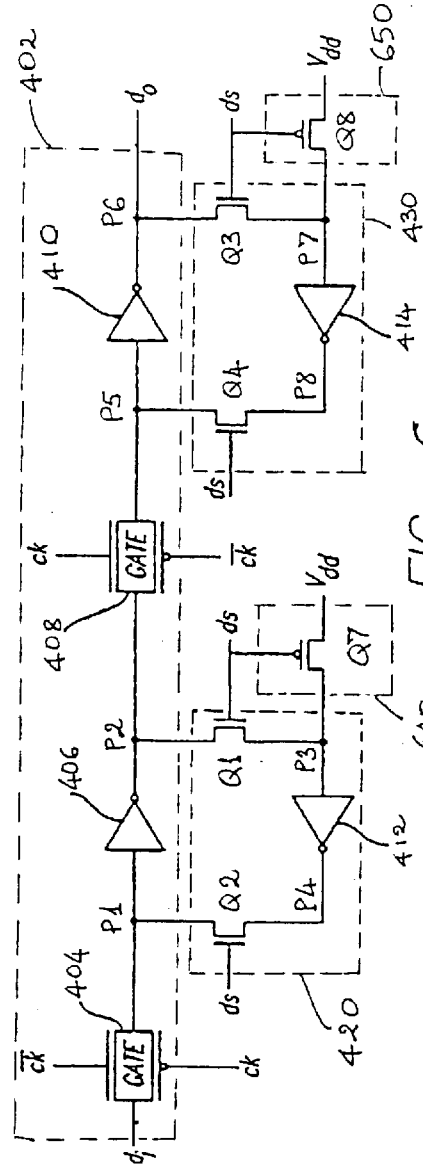
FIG. 5
FIG. 6

DYNAMIC REGISTER WITH LOW CLOCK RATE TESTING CAPABILITY

CROSS-REFERENCE TO RELATED APPLICATIONS

The present application is a continuation of U.S. patent application Ser. No. 09/775,243, filed on Feb. 1, 2001 now U.S. Pat. No. 6,456,552, which is a continuation of U.S. patent application Ser. No. 09/437,723 filed on Nov. 9, 1999 and now U.S. Pat. No. 6,212,116, which claims priority on the basis of the following provisional applications, the contents of which are herein incorporated by reference: Ser. No. 60/107,878, entitled "Static-dynamic Register," filed on Nov. 9, 1998; Ser. No. 60/108,319, entitled "Gigabit Ethernet Transceiver," filed on Nov. 13, 1998; Ser. No. 60/130,616, entitled "Multi-pair Gigabit Ethernet Transceiver," filed on Apr. 22, 1999.

The present application is related to the following applications filed on the same day as the present application and assigned to the same assignee, the contents of each of which are herein incorporated by reference: Ser. No. 09/860,743 entitled "Efficient FIR Filter for High-Speed Communication" and Ser. No. 09/437,719 entitled "Multi-Pair Gigabit Ethernet Transceiver".

BACKGROUND OF THE INVENTION

1. Field of the Invention

The present invention relates generally to dynamic registers. More particularly, the invention relates to a method and a system for refreshing a dynamic register included in a high-speed communication integrated circuit while the integrated circuit is undergoing low frequency testing such as scan testing.

2. Description of Related Art

In a Gigabit Ethernet communication system that conforms to the IEEE 802.3ab (also termed 1000BASE-T) standard, gigabit transceivers are connected via four Category 5 twisted pairs of copper cables. Symbol data are transmitted at the rate of 250 megabits per second (Mbps) on each twisted pair of copper cable.

A Gigabit Ethernet transceiver includes a larger number of adaptive filters, which in turn require a large number of registers. The registers operate at the clock rate of 125 megahertz (MHz). Dynamic registers are preferred over static registers due to their low power consumption and faster operating speed. A dynamic register consumes only about half the power consumed by a static register. Thus, the requirements of low power consumption and high operating speed of the Gigabit Ethernet transceiver necessitate the use of dynamic registers instead of static registers in most of the adaptive filters included in the Gigabit Ethernet transceiver. However, a dynamic register would lose its contents if it is operated at low clock rate.

The fact that dynamic registers lose their data contents when they are operated at low clock rate pose a problem in low clock rate testing such as scan testing of a chip. Scan testing is performed at production time to sort out the defective chips from a batch of chips. Structure allowing a chip to operate in scan mode is included in the design of the chip. In the scan mode, all the registers in the chip are connected in chain to form a long shift register. The path that connects the registers together is called the scan path, and is determined based on layout efficiency. The scan testing is as follows. First, the chip is reset. Then it operates normally with a deterministic input data. The normal operation is then stopped. The chip is switched to scan mode. The data inside the chip are shifted out. This data is called the signature of the chip. A test machine compares this signature with an expected output pattern (obtained by simulation of a good chip). If there is a match, then the chip is good. Otherwise, the chip has a defect. Scan testing is performed at low clock rate, thus cannot be performed satisfactorily with dynamic registers.

Thus, there is a need for a method and a system for refreshing a dynamic register included in an integrated circuit while the integrated circuit is undergoing low clock rate testing.

SUMMARY OF THE INVENTION

The present invention provides a method for refreshing data in a circuit element included in a dynamic register. A static loop is coupled to the circuit element as a feedback path from the output terminal to the input terminal of the circuit element. A control signal is provided to the static loop. The static loop is activated via the control signal to refresh the data in the circuit element.

The present invention provides a system for refreshing a dynamic register. The dynamic register includes a first transmission gate, a first inverter, a second transmission gate and a second inverter connected in series. The first and second transmission gates operate in accordance with complementary clock signals. A first static loop is coupled to the first inverter as a feedback path from the output terminal of the first inverter to the input terminal of the first inverter. The first static loop is activated or deactivated by a control signal. When activated, the first static loop refreshes the first inverter. A second static loop is coupled to the second inverter as a feedback path from the output terminal to the input terminal of the second inverter. The second static loop is activated or deactivated by the control signal. When activated, the second static loop refreshes the second inverter.

BRIEF DESCRIPTION OF THE DRAWINGS

These and other features, aspects and advantages of the present invention will be more fully understood when considered with respect to the following detailed description, appended claims and accompanying drawings, wherein:

FIG. 5 is a schematic diagram of a second embodiment of a dynamic register with low clock rate testing capability, constructed in accordance with the present invention;

FIG. 6 is a schematic diagram of a third embodiment of a dynamic register with low clock rate testing capability, constructed in accordance with the present invention.

DETAILED DESCRIPTION OF THE INVENTION

The present invention is a method and a system for preventing a node in a circuit from having an unknown floating voltage during a steady state of a clock signal. The system includes a control circuit to determine the voltage at the node. The node is either driven by an input signal or is pulled to a fixed voltage. As applied to a dynamic register, the method is to prevent a substantial amount of power supply current from being dissipated in the dynamic register during a steady state of the clock signal.

In one application of the present invention, the circuit is a dynamic register which includes a CMOS type transmission gate and an inverter disposed in series.

Dynamic registers are used in most of adaptive filters that are included in a Gigabit Ethernet transceiver of a communication system. For ease of explanation, the present invention will be described in detail as applied to this exemplary application. However, this is not to be construed as a limitation of the present invention.

Figure 1:
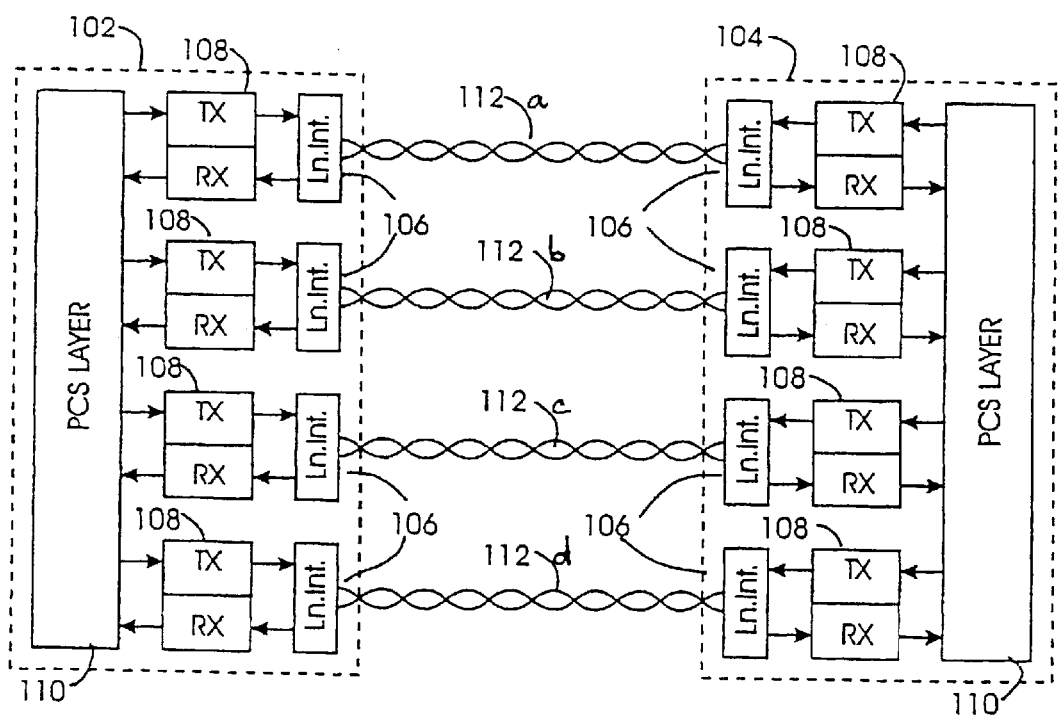
FIG. 1 is a simplified block diagram of a high-speed communication system including two gigabit transceivers configured to communicate over multiple twisted pair wiring channels.

In order to appreciate the advantages of the present invention, it will be beneficial to describe the invention in the context of an exemplary bidirectional communication device, such as an Ethernet transceiver. The particular exemplary implementation chosen is depicted in FIG. 1, which is a simplified block diagram of a multi-pair communication system operating in conformance with the IEEE 802.3ab standard (also termed 1000BASE-T) for 1 gigabit (Gb/s) Ethernet full-duplex communication over four twisted pairs of Category-5 copper wires. The communication system illustrated in FIG. 1 is represented as a point-to-point system, in order to simplify the explanation, and includes two main transceiver blocks 102 and 104, coupled together via four twisted-pair cables 112a, b, c and d. Each of the wire pairs 112a, b, c, d is coupled to each of the transceiver blocks 102, 104 through a respective one of four line interface circuits 106. Each of the wire pairs 112a, b, c, d facilitates communication of information between corresponding pairs of four pairs of transmitter/receiver circuits (constituent transceivers) 108. Each of the constituent transceivers 108 is coupled between a respective line interface circuit 106 and a Physical Coding Sublayer (PCS) block 110. At each of the transceiver blocks 102 and 104, the four constituent transceivers 108 are capable of operating simultaneously at 250 megabits of information data per second (Mb/s) each, and are coupled to the corresponding remote constituent transceivers through respective line interface circuits to facilitate full-duplex bidirectional operation. Thus, 1 Gb/s communication throughput of each of the transceiver blocks 102 and 104 is achieved by using four 250 Mb/s (125 Mbaud at 2 information data bits per symbol) constituent transceivers 108 for each of the transceiver blocks 102, 104 and four pairs of twisted copper cables to connect the two transceiver blocks 102, 104 together.

Figure 2:
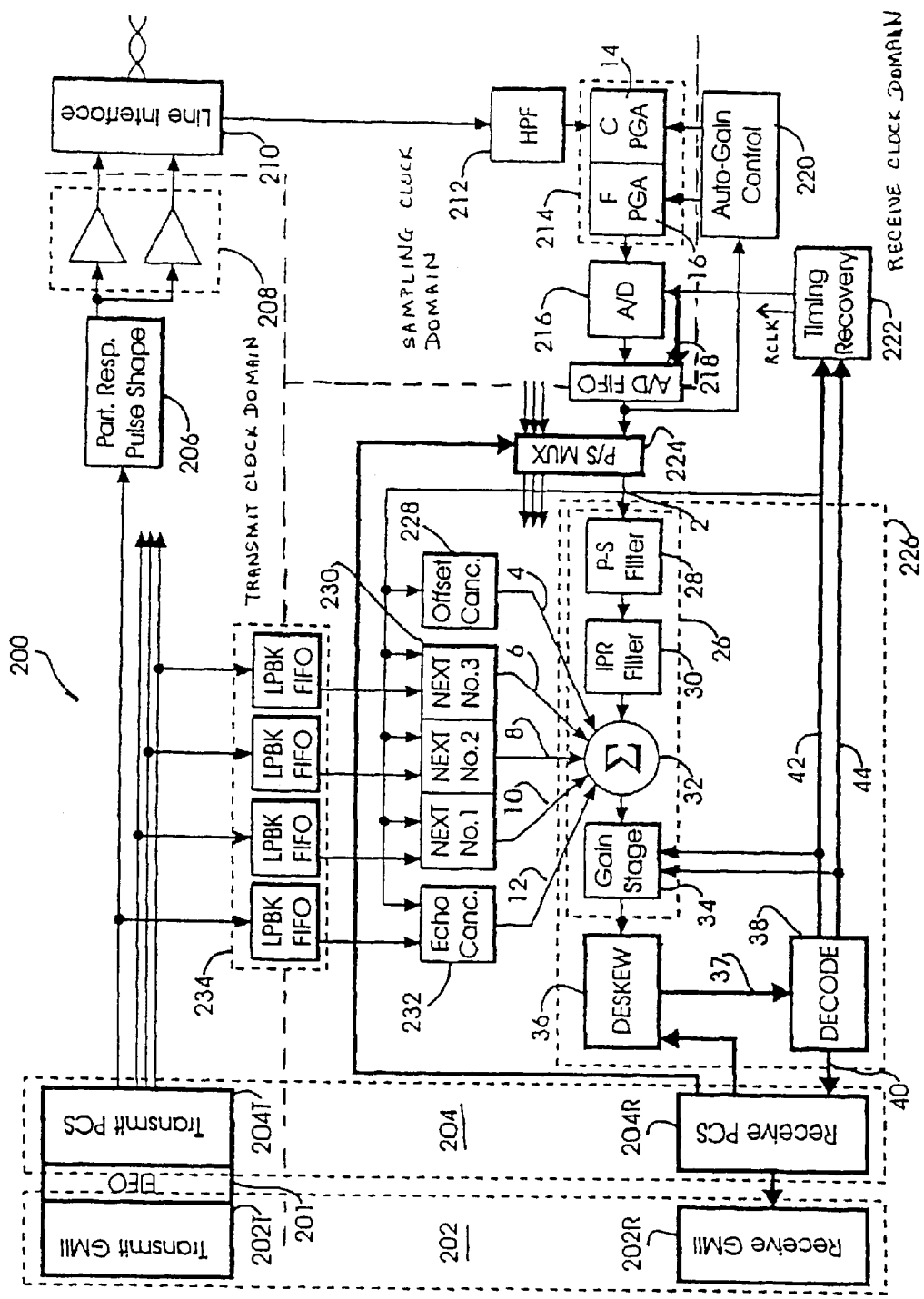
FIG. 2 is a block diagram of an exemplary gigabit transceiver.

FIG. 2 is a simplified block diagram of the functional architecture and internal construction of an exemplary transceiver block, indicated generally at 200, such as transceiver 102 of FIG. 1. Since the illustrative transceiver application relates to gigabit Ethernet transmission, the transceiver will be referred to as the "gigabit transceiver". For ease of illustration and description, FIG. 2 shows only one of the four 250 Mb/s constituent transceivers which are operating simultaneously (termed herein 4-D operation). However, since the operation of the four constituent transceivers are necessarily interrelated, certain blocks and signal lines in the exemplary embodiment of FIG. 2 perform four-dimensional operations and carry four-dimensional (4-D) signals, respectively. By 4-D, it is meant that the data from the four constituent transceivers are used simultaneously. In order to clarify signal relationships in FIG. 2, thin lines correspond to 1-dimensional functions or signals (i.e., relating to only a single constituent transceiver), and thick lines correspond to 4-D functions or signals (relating to all four constituent transceivers).

Referring to FIG. 2, the gigabit transceiver 200 includes a Gigabit Medium Independent Interface (GMII) block 202 subdivided into a receive GMII circuit 202R and a transmit GMII circuit 202T. The transceiver also includes a Physical Coding Sublayer (PCS) block 204, subdivided into a receive PCS circuit 204R and a transmit PCS circuit 204T, a pulse shaping filter 206, a digital-to analog (D/A) converter block 208, and a line interface block 210, all generally encompassing the transmitter portion of the transceiver.

The receiver portion generally includes a highpass filter 212, a programmable gain amplifier (PGA) 214, an analog-to-digital (A/D) converter 216, an automatic gain control (AGC) block 220, a timing recovery block 222, a pair-swap multiplexer block 224, a demodulator 226, an offset canceller 228, a near-end crosstalk (NEXT) canceller block 230 having three constituent NEXT cancellers and an echo canceller 232.

The gigabit transceiver 200 also includes an A/D first-in-first-out buffer (FIFO) 218 to facilitate proper transfer of data from the analog clock region to the receive clock region, and a loopback FIFO block (LPBK) 234 to facilitate proper transfer of data from the transmit clock region to the receive clock region. The gigabit transceiver 200 can optionally include an additional adaptive filter to cancel far-end crosstalk noise (FEXT canceller).

In operational terms, on the transmit path, the transmit section 202T of the GMII block receives data from the Media Access Control (MAC) module in byte-wide format at the rate of 125 MHz and passes them to the transmit section 204T of the PCS block via the FIFO 201. The FIFO 201 ensures proper data transfer from the MAC layer to the Physical Coding (PHY) layer, since the transmit clock of the PHY layer is not necessarily synchronized with the clock of the MAC layer. In one embodiment, this small FIFO 201 has from about three to about five memory cells to accommodate the elasticity requirement which is a function of frame size and frequency offset.

The PCS transmit section 204T performs certain scrambling operations and, in particular, is responsible for encoding digital data into the requisite codeword representations appropriate for transmission. In, the illustrated embodiment of FIG. 2, the transmit PCS section 204T incorporates a coding engine and signal mapper that implements a trellis coding architecture, such as required by the IEEE 802.3 ab specification for gigabit transmission.

In accordance with this encoding architecture, the PCS transmit section 204T generates four 1-D symbols, one for each of the four constituent transceivers. The 1-D symbol generated for the constituent transceiver depicted in FIG. 2 is filtered by the pulse shaping filter 206. This filtering assists in reducing the radiated emission of the output of the transceiver such that it falls within the parameters required by the Federal Communications Commission. The pulse shaping filter 206 is implemented so as to define a transfer function of $0.75+0.25z^{-1}$. This particular implementation is chosen so that the power spectrum of the output of the transceiver falls below the power spectrum of a 100Base-Tx signal. The 100Base-Tx is a widely used and accepted Fast Ethernet standard for 100 Mb/s operation on two pairs of Category-5 twisted pair cables. The output of the pulse shaping filter 206 is converted to an analog signal by the D/A converter 208 operating at 125 MHz. The analog signal passes through the line interface block 210, and is placed on the corresponding twisted pair cable.

On the receive path, the line interface block 210 receives an analog signal from the twisted pair cable. The received analog signal is preconditioned by the highpass filter 212 and the PGA 214 before being converted to a digital signal by the A/D converter 216 operating at a sampling rate of 125 MHz. The timing of the A/D converter 216 is controlled by the output of the timing recovery block 222. The resulting digital signal is properly transferred from the analog clock region to the receive clock region by the A/D FIFO 218. The output of the A/D FIFO 218 is also used by the AGC 220 to control the operation of the PGA 214.

The output of the A/D FIFO 218, along with the outputs from the A/D FIFOs of the other three constituent transceivers are inputted to the pair-swap multiplexer block 224. The pair-swap multiplexer block 224 uses the 4-D pair-swap control signal from the receive section 204R of PCS block to sort out the four input signals and send the correct signals to the respective feedforward equalizers 26 of the demodulator 226. This pair-swapping control is needed for the following reason. The trellis coding methodology used for the gigabit transceivers (101 and 102 of FIG. 1) is based on the fact that a signal on each twisted pair of wire corresponds to a respective 1-D constellation, and that the signals transmitted over four twisted pairs collectively form a 4-D constellation. Thus, for the decoding to work, each of the four twisted pairs must be uniquely identified with one of the four dimensions. Any undetected swapping of the four pairs would result in erroneous decoding. In an alternate embodiment of the gigabit transceiver, the pair-swapping control is performed by the demodulator 226, instead of the combination of the PCS receive section 204R and the pair-swap multiplexer block 224.

The demodulator 226 includes a feed-forward equalizer (FFE) 26 for each constituent transceiver, coupled to a deskew memory circuit 36 and a decoder circuit 38, implemented in the illustrated embodiment as a trellis decoder. The deskew memory circuit 36 and the trellis decoder 38 are common to all four constituent transceivers. The FFE 26 receives the received signal intended for it from the pair-swap multiplexer block 224. The FFE 26 is suitably implemented to include a precursor filter 28, a programmable inverse partial response (IPR) filter 30, a summing device 32, and an adaptive gain stage 34. The FFE 26 is a least-mean-squares (LMS) type adaptive filter which is configured to perform channel equalization as will be described in greater detail below.

The precursor filter 28 generates a precursor to the input signal 2. This precursor is used for timing recovery. The transfer function of the precursor filter 28 might be represented as $-\gamma+z^{-1}$, with $\gamma$ equal to $1/16$ for short cables (less than 80 meters) and $1/8$ for long cables (more than 80 m). The determination of the length of a cable is based on the gain of the coarse PGA 14 of the programmable gain block 214.

The programmable IPR filter 30 compensates the ISI (intersymbol interference) introduced by the partial response pulse shaping in the transmitter section of a remote transceiver which transmitted the analog equivalent of the digital signal 2. The transfer function of the IPR filter 30 may be expressed as $1/(1+Kz^{-1})$. In the present example, K has an exemplary value of 0.484375 during startup, and is slowly ramped down to zero after convergence of the decision feedback equalizer included inside the trellis decoder 38. The value of K may also be any positive value strictly less than 1.

The summing device 32 receives the output of the IPR filter 30 and subtracts therefrom adaptively derived cancellation signals received from the adaptive filter block, namely signals developed by the offset canceller 228, the NEXT cancellers 230, and the echo canceller 232. The offset canceller 228 is an adaptive filter which generates an estimate of signal offset introduced by component circuitry of the transceiver's analog front end, particularly offsets introduced by the PGA 214 and the A/D converter 216.

The three NEXT cancellers 230 may also be described as adaptive filters and are used, in the illustrated embodiment, for modeling the NEXT impairments in the received signal caused by interference generated by symbols sent by the three local transmitters of the other three constituent transceivers. These impairments are recognized as being caused by a crosstalk mechanism between neighboring pairs of cables, thus the term near-end crosstalk, or NEXT. Since each receiver has access to the data transmitted by the other three local transmitters, it is possible to approximately replicate the NEXT impairments through filtering. Referring to FIG. 2, the three NEXT cancellers 230 filter the signals sent by the PCS block to the other three local transmitters and produce three signals replicating the respective NEXT impairments. By subtracting these three signals from the output of the IPR filter 30, the NEXT impairments are approximately cancelled.

Due to the bi-directional nature of the channel, each local transmitter causes an echo impairment on the received signal of the local receiver with which it is paired to form a constituent transceiver. In order to remove this impairment, an echo canceller 232 is provided, which may also be characterized as an adaptive filter, and is used, in the illustrated embodiment, for modeling the signal impairment due to echo. The echo canceller 232 filters the signal sent by the PCS block to the local transmitter associated with the receiver, and produces an approximate replica of the echo impairment. By subtracting this replica signal from the output of the IPR filter 30, the echo impairment is approximately cancelled.

The adaptive gain stage 34 receives the processed signal from the summing circuit 32 and fine tunes the signal path gain using a zero-forcing LMS algorithm. Since this adaptive gain stage 34 trains on the basis of error signals generated by the adaptive filters 228, 230 and 232, it provides a more accurate signal gain than the one provided by the PGA 214 in the analog section.

The output of the adaptive gain stage 34, which is also the output of the FFE 26, is inputted to the deskew memory circuit 36. The deskew memory 36 is a four-dimensional function block, i.e., it also receives the outputs of the three FFEs of the other three constituent transceivers. There may be a relative skew in the outputs of the four FFEs, which are the four signal samples representing the four symbols to be decoded. This relative skew can be up to 50 nanoseconds, and is due to the variations in the way the copper wire pairs are twisted. In order to correctly decode the four symbols, the four signal samples must be properly aligned. The deskew memory aligns the four signal samples received from the four FFEs, then passes the deskewed four signal samples to a decoder circuit 38 for decoding.

In the context of the exemplary embodiment, the data received at the local transceiver was encoded before transmission, at the remote transceiver. In the present case, data might be encoded using an 8-state four-dimensional trellis code, and the decoder 38 might therefore be implemented as a trellis decoder. In the absence of intersymbol interference (ISI), a proper 8-state Viterbi decoder would provide optimal decoding of this code. However, in the case of Gigabit Ethernet, the Category-5 twisted pair cable introduces a significant amount of ISI. In addition, the partial response filter of the remote transmitter on the other end of the communication channel also contributes some ISI. Therefore, the trellis decoder 38 must decode both the trellis code and the ISI, at the high rate of 125 MHz. In the illustrated embodiment of the gigabit transceiver, the trellis decoder 38 includes an 8-state Viterbi decoder, and uses a decision-feedback sequence estimation approach to deal with the ISI components.

The 4-D output of the trellis decoder 38 is provided to the PCS receive section 204R. The receive section 204R of the PCS block de-scrambles and decodes the symbol stream, then passes the decoded packets and idle stream to the receive section 202T of the GMII block which passes them to the MAC module. The 4-D outputs, which are the error and tentative decision, respectively, are provided to the timing recovery block 222, whose output controls the sampling time of the A/D converter 216. One of the four components of the error and one of the four components of the tentative decision correspond to the receiver shown in FIG. 2, and are provided to the adaptive gain stage 34 of the FFE 26 to adjust the gain of the equalizer signal path. The error component portion of the decoder output signal is also provided, as a control signal, to adaptation circuitry incorporated in each of the adaptive filters 228, 229, 230, 231 and 232. Adaptation circuitry is used for the updating and training process of filter coefficients.

Figure 3A:
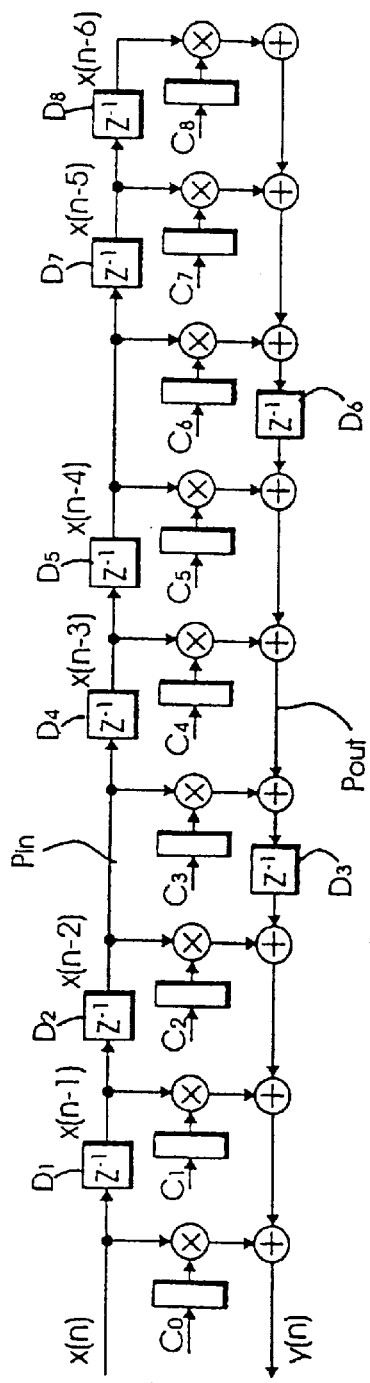
FIG. 3A is a simplified structure diagram of an adaptive FIR filter as might be implemented as an echo/NEXT canceller circuit in one embodiment of the gigabit transceiver.

The adaptive filters used to implement the echo canceller 232 and the NEXT cancellers 230 are typically finite impulse response (FIR) filters. FIG. 3A shows a structure of an adaptive FIR filter used as an echo/NEXT canceller in one embodiment of the gigabit transceiver.

Referring to FIG. 3A, the adaptive FIR filter includes an input signal path $P_{in}$, an output signal path $P_{out}$, and N taps (N is 9 in FIG. 3A). Each tap connects a point on the input signal path $P_{in}$ to a point on the output signal path $P_{out}$. Each tap, except for the last tap, includes a coefficient $C_i$, a multiplier $M_i$ and an adder $A_i$, i=0, . . . , N−2. The last tap includes the coefficient $C_{N-1}$, the multiplier $M_{N-1}$, and no adder. The coefficients $C_i$, where i=0, . . . , N−1, are stored in coefficient registers. During each adaptation process, the values of the coefficients $C_i$ are trained using a well-known least-mean-squares algorithm by an adaptation circuitry (not shown in FIG. 3A). After training, the coefficients $C_i$ converge to stable values. The FIR filter includes a set of delay elements $D_i$, where each delay element is implemented in the CMOS dynamic register 300 in FIG. 3A. The number of delay elements $D_i$ determines the order of the FIR filter. The output y(n), i.e., the filter output at time instant n, is a function of the input at time instant n and of the past inputs at time instants n−1 through n−(N−1), and is expressed as:

$$y(n) = \sum_{i=0}^{N-1} C_i x(n-i) \quad (1)$$

where x(n−i) denotes the input at time instant n−i, and N denotes the number of taps. The output y(n), as shown in Equation (1), is a weighted sum of the input data x(n−i), with i=0, . . . , N−1. The coefficients $C_i$ act as the weighting factors on the input data. If a coefficient $C_i$ has a very small absolute value, relative to the values of other coefficients, then the contribution of the corresponding input data x(n−i) to the value of y(n) is relatively insignificant.

Figure 3B:
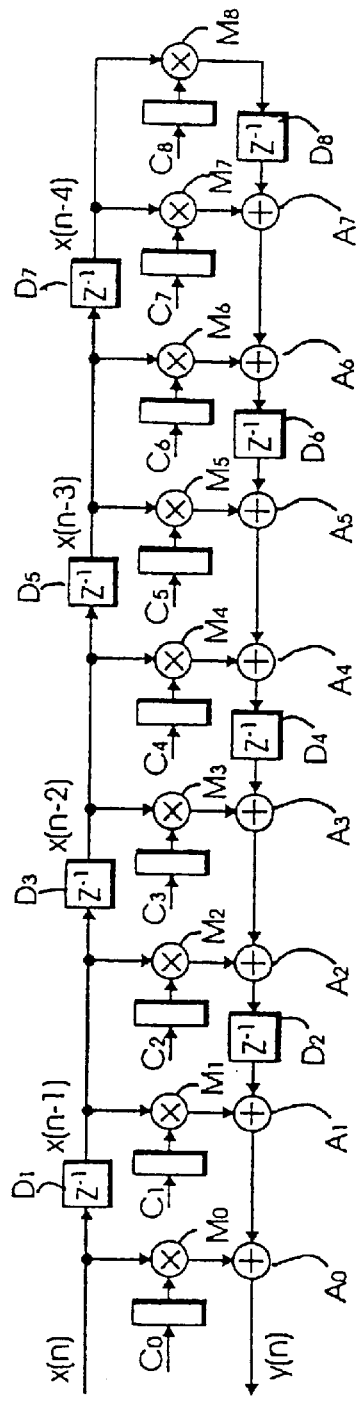
FIG. 3B is an equivalent structure of the adaptive FIR filter shown in FIG. 3A.

FIG. 3B is an equivalent structure of the filter shown in FIG. 3A. The two structures in FIGS. 3A and 3B provide the same filter transfer function, but differ in certain performance characteristics. The difference is due to the placement of the delay elements $D_i$, i=1, . . . , N−1 (N=9 in FIGS. 3A, 3B). If all the delay elements are placed in the input path $P_{in}$, as in the well-known direct form of the FIR filter, then the registers that are used to implement the delay elements are small, need only to be of the same size as the input data x(n). If all the delay elements are placed on the output path $P_{out}$, as in the well-known transposed form of the FIR filter, then the registers used as the delay elements must have more bits in order to hold the largest possible sum of products $C_i^* x(n-i)$. Large registers cost more and consume more power than small registers. Thus, the advantage of placing the delay elements on the input path instead of the output path is that fewer register bits are required. However, the larger the number of the delay elements on the input path, the lower the operating speed of the filter is.

If the propagation delay from the input of the filter to the last tap exceeds the required clock period, then the filter is not usable. To break the long propagation delay, that would occur if all the delay elements were placed on the input path $P_{in}$, into small delay intervals, some of the delay elements are placed on the output path $P_{out}$, at regular intervals, as shown in the filter structures in FIGS. 3A and 3B. The structure in FIG. 3B, which has a "two-to-one" split of delay elements between the input path and the output path, can operate at a higher clock speed than the structure in FIG. 3A, which has a "three-to-one" split. Computational results show that both of these structures are acceptable for use in a high-speed system such as the gigabit transceiver. The taps of the adaptive FIR filters used in the gigabit transceiver can be switched from an active state to an inactive state.

Each of the delay elements $D_i$ is implemented by a stack of individual CMOS dynamic registers, each of the individual CMOS dynamic registers handling one bit of data. The present invention provides a structure for each of the dynamic registers such that the dynamic registers operate in a static mode during low clock rate testing of the gigabit transceiver chip. In other words, the present invention allow the dynamic registers to retain their data contents when they are clocked at a low clock rate.

Figure 4:
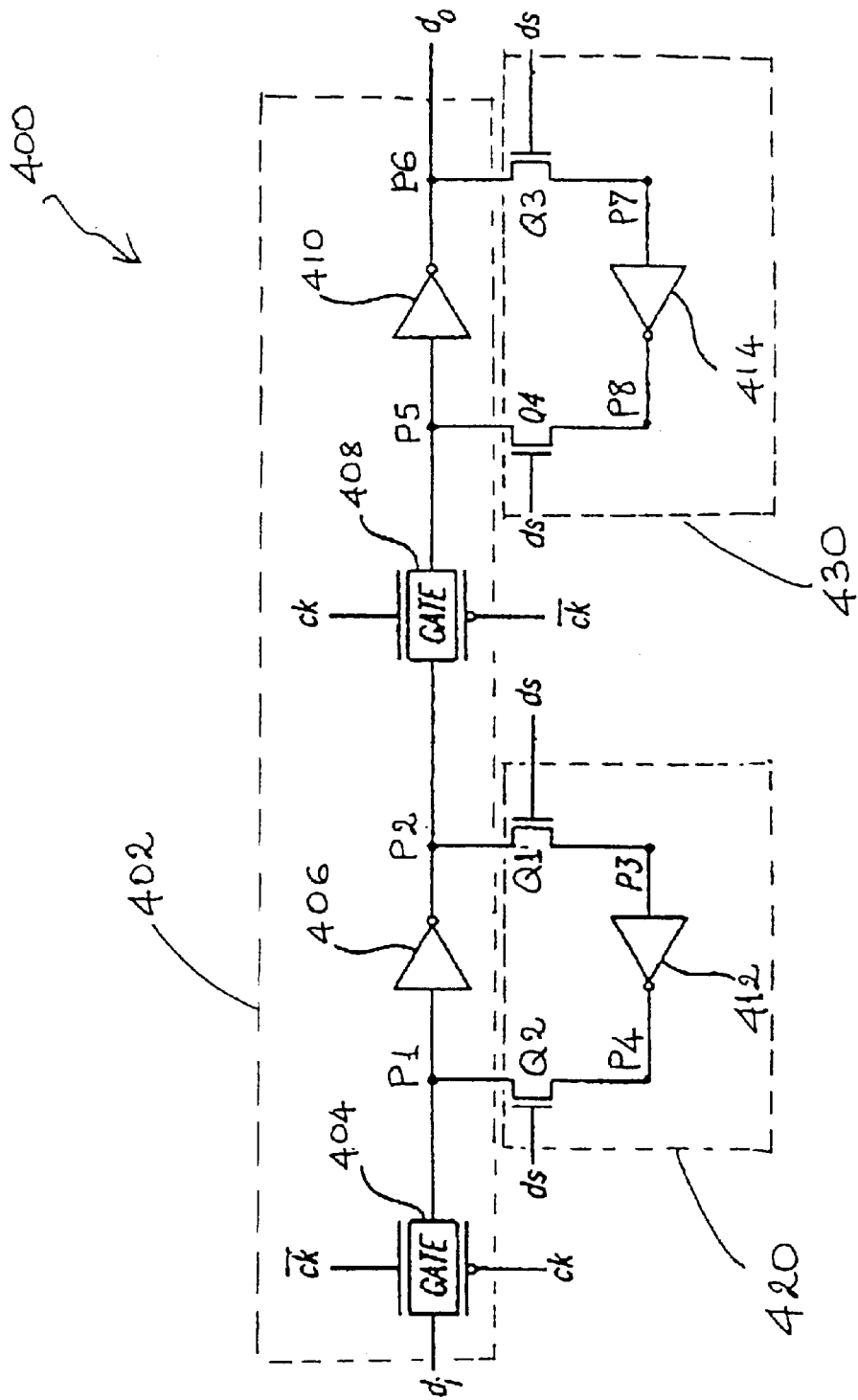
FIG. 4 is a schematic diagram of a first embodiment of a dynamic register with low clock rate testing capability, constructed in accordance with the present invention.

FIG. 4 is a block diagram illustrating a first embodiment of the present invention. The circuit 400 includes a dynamic register 402 and two static loops 420 and 430.

The structure of the dynamic register 402 is the traditional structure of a rising edge dynamic register. The dynamic register 402 is called a rising edge dynamic register because at each rising edge of the clock signal, input data gets "pushed" through the register. In other words, data that are present at the input of the register 402 when the clock signal ck is low appears at the output of the register 402 at the rising edge of the clock signal as the clock signal ck transits from low to high.

The dynamic register 402 includes a first transmission gate 404, an inverter 406, a second transmission gate 408, and an inverter 410 connected in series. The transmission gates 404 and 408 operate in accordance with complementary clock signals, i.e., clock signals that are inverses of each other, thus only one transmission gate would be open at a time. When the clock signal ck is low, the transmission gate 404 receives an input signal $d_i$, lets it pass through node P1 and inverter 406. The voltage at node P2 is equal to the inverse of the value of $d_i$. While the transmission gate 404 is open, the transmission gate 408 closes its transmission path, preventing the signal at node P2 from passing through. When the clock signal ck transits from low to high, the transmission gate 404 closes and transmission gate 408 opens, allowing the signal at node P2 to pass through. The inverter 410 inverts the signal voltage at node P5 and produces a signal voltage at node P6 approximately equal to the one that were clocked into the dynamic register 402 when the clock signal ck was low.

Transmission gates 404 and 408 have leakage and do not provide perfect isolation to the inverters 406 and 410. Due to this non-perfect isolation, the voltages present at the inputs of inverters 406 and 410 decay rapidly and will be lost if not clocked out rapidly.

The two static loops 420 and 430 allow the data, i.e., voltages, at the inputs of inverters 406 and 410 to be refreshed. This refreshing process allows the dynamic register 402 to function in a static mode, i.e., to retain its data contents at low clock rate.

The static loop 420 is coupled to the inverter 406 as a feedback loop. The static loop 420 includes a N-type MOS transistor Q1, an inverter 412 and a N-type MOS transistor Q2 connected in series. The gate terminals of the transistors Q1 and Q2 are coupled to a control signal ds.

When the control signal ds is high (i.e., logical "1"), the transistors Q1 and Q2 are turned on. Since transistor Q1 is on, the voltage at node P3 is approximately equal to the voltage at node P2. The inverter 412 produces a voltage at P4 approximately equal to the inverse of the voltage at P3. Since transistor Q2 is on, the voltage at P1 is approximately equal to the voltage at P4. Thus, in effect, the static loop 420 inverts the voltage at P2 and produces this inverse voltage at P1. Therefore, when the static loop 420 is activated by the control signal ds, the data voltage present at the input of the inverter 406 right before the static loop 420 is activated is continuously regenerated and presented at the input of the inverter 406. Consequently, data output of inverter 406 is continuously regenerated.

When the control signal ds is low (i.e., logical "0"), the transistors Q1 and Q2 are turned off. Since both transistors Q1 and Q2 are off, the static loop 420 is practically de-coupled from the dynamic register 402. Therefore, when the static loop 420 is deactivated by the control signal ds, the inverter 406 functions in its normal mode, i.e., the dynamic mode.

The static loop 430 is coupled to the inverter 410 as a feedback loop. The static loop 430 includes a N-type MOS transistor Q3, an inverter 414 and a N-type MOS transistor Q4 connected in series. The gate terminals of the transistors Q3 and Q4 are coupled to a control signal ds.

When the control signal ds is high (i.e., logical "1"), the transistors Q3 and Q4 are turned on. Since transistor Q3 is on, the voltage at node P7 is approximately equal to the voltage at node P6. The inverter 414 produces a voltage at P8 approximately equal to the inverse of the voltage at P7. Since transistor Q4 is on, the voltage at P5 is approximately equal to the voltage at P8. Thus, in effect, the static loop 420 inverts the voltage at P6 and produces this inverse voltage at P5. Therefore, when the static loop 430 is activated by the control signal ds, the data voltage present at the input of the inverter 410 right before the static loop 430 is activated is continuously regenerated and presented at the input of the inverter 410. Consequently, data output of inverter 410 is continuously regenerated.

When the control signal ds is low (i.e., logical "0"), the transistors Q3 and Q4 are turned off. Since both transistors Q3 and Q4 are off, the static loop 430 is practically de-coupled from the dynamic register 402. Therefore, when the static loop 430 is deactivated by the control signal ds, the inverter 410 functions in its normal mode, i.e., the dynamic mode.

In summary, when the control signal is high, the static loops 420 and 430 are activated, refreshing data voltages at the inputs and outputs of the inverters 406 and 410, thus, allowing the dynamic register 402 to operate in a static mode. When the control signal is low, the static loops 420 and 430 are deactivated and exert practically no influence on the dynamic register 402, and the dynamic register 402 operates in its normal mode, i.e., dynamic mode. It is noted that the control signal is a one-bit signal. Thus, with one-bit control signal, the dynamic register can be switched from one operational mode to the other.

It is important to note that, during a static mode operation, it is possible for new input data $d_i$ to be clocked into the dynamic register 402 while the static loops are active in refreshing data for the inverters 406 and 410. In this situation, the new data input is ultimately available at node P1 and P5. The reason is that the static loops are weak loops. Thus, when there is conflict at nodes P1 and P5 between data regenerated by the static loops and new input data di, the new input data prevails over the regenerated data.

FIG. 5 is a block diagram illustrating a second embodiment of the present invention. The circuit 500 includes the dynamic register 402, two static loops 420 and 430, and two auxiliary circuits 540 and 550. The difference between this circuit 500 and the circuit 400 (FIG. 4) is the inclusion of the two auxiliary circuits 540 and 550. The two auxiliary circuits 540 and 550 are used as a precautionary measure to prevent floating voltages at nodes P3 and P7 when the static loops 420 and 430 are deactivated. Floating voltage may exist when a circuit node is not driven by voltage at another node, or not tied down to a fixed known voltage. Floating voltage may be caused by leftover charge at the node from a previous operation. Floating voltages are undesirable since they could cause current to be drawn from power supply. It is good practice design to tie down all nodes that could become floating nodes.

The auxiliary circuit 540 includes an inverter 542 and an N-type MOS transistor Q5 connected in series. The input of the inverter 542 is driven by the control signal ds. The output of the inverter 542 is coupled to the gate terminal of the transistor Q5. The drain terminal of transistor Q5 is coupled to node P3. The source terminal of transistor Q5 is coupled to ground.

When the control signal ds is low (i.e., logical "0"), the transistors Q1 and Q2 are turned off and the static loop 420 is practically de-coupled from the dynamic register 402. Since transistor Q1 is off, node P3 is not driven by the voltage at node P2 and may have a floating voltage. The auxiliary circuit 540 allows the node P3 to be tied down to ground, as described in the following. When the control signal ds is low, the output of the inverter 542 is high, causing the transistor Q5 to turn on. Since transistor Q5 is on, its drain and source terminals have the same voltage. Thus, node P3, which is coupled to the drain terminal of Q5, is pulled to ground.

When the control signal ds is high (i.e., logical "1"), the transistors Q1 and Q2 are turned on, and the static loop 420 is activated. Since the control signal ds is high, the output of the inverter 542 is low, causing the transistor Q5 to be off. Thus, in this case, transistor Q5 exerts no influence on node P3.

The auxiliary circuit 550 includes an inverter 552 and an N-type MOS transistor Q6 connected in series. The input of the inverter 552 is driven by the control signal ds. The output of the inverter 552 is coupled to the gate terminal of the transistor Q6. The drain terminal of transistor Q6 is coupled to node P7. The source terminal of transistor Q6 is coupled to ground.

When the control signal ds is low (i.e., logical "0"), the transistors Q3 and Q4 are turned off and the static loop 430 is exerts no influence on the dynamic register 402. Since transistor Q3 is off, node P7 is not driven by the voltage at node P6 and may have a floating voltage. The auxiliary circuit 550 allows the node P7 to be tied down to ground, as described in the following. When the control signal ds is low, the output of the inverter 552 is high, causing the transistor Q6 to turn on. Since transistor Q6 is on, its drain and source terminals have the same voltage. Thus, node P7, which is coupled to the drain terminal of Q6, is pulled to ground.

When the control signal ds is high (i.e., logical "1"), the transistors Q3 and Q4 are turned on, and the static loop 430 is activated. Since the control signal ds is high, the output of the inverter 552 is low, causing the transistor Q6 to be off. Thus, in this case, transistor Q6 exerts no influence on node P7.

FIG. 6 is a block diagram illustrating a third embodiment of the present invention. The circuit 600 includes the dynamic register 402, two static loops 420 and 430, and two auxiliary circuits 640 and 650. The difference between this circuit 600 and the circuit 400 (FIG. 4) is the inclusion of the two auxiliary circuits 640 and 650. The two auxiliary circuits 640 and 650 are used as a precautionary measure to prevent floating voltages at nodes P3 and P7 when the static loops 420 and 430 are deactivated. The difference between this circuit 600 and the circuit 500 (FIG. 5) is that the two auxiliary circuits 640 and 650 include P-type MOS transistors and no inverters.

The auxiliary circuit 640 includes a P-type MOS transistor Q7. The gate terminal of the transistor Q7 is driven by the control signal ds. The drain terminal of transistor Q7 is coupled to node P3. The source terminal of transistor Q7 is coupled to a positive voltage source $V_{dd}$.

When the control signal ds is low (i.e., logical "0"), the transistors Q1 and Q2 are turned off and the static loop 420 exerts no influence on the dynamic register 402. Since transistor Q1 is off, node P3 is not driven by the voltage at node P2 and may have a floating voltage. The auxiliary circuit 640 allows the node P3 to be pulled to $V_{dd}$, as described in the following. When the control signal ds is low, the transistor Q7 is on. Since transistor Q7 is on, its drain and source terminals have the same voltage. Thus, node P3, which is coupled to the drain terminal of Q7, is pulled to $V_{dd}$.

When the control signal ds is high (i.e., logical "1"), the transistors Q1 and Q2 are turned on, and the static loop 420 is activated. Since the control signal ds is high, the transistor Q7 is be off. Thus, in this case, transistor Q7 exerts no influence on node P3.

The auxiliary circuit 650 includes a P-type MOS transistor Q8. The gate terminal of the transistor Q8 is driven by the control signal ds. The drain terminal of transistor Q8 is coupled to node P7. The source terminal of transistor Q8 is coupled to the positive voltage source $V_{dd}$.

When the control signal ds is low (i.e., logical "0"), the transistors Q3 and Q4 are turned off and the static loop 430 is exerts no influence on the dynamic register 402. Since transistor Q3 is off, node P7 is not driven by the voltage at node P6 and may have a floating voltage. The auxiliary circuit 650 allows the node P7 to be pulled to ground, as described in the following. When the control signal ds is low, the transistor Q8 is on. Since transistor Q8 is on, its drain and source terminals have the same voltage. Thus, node P7, which is coupled to the drain terminal of Q8, is pulled to $V_{dd}$.

When the control signal ds is high (i.e., logical "1"), the transistors Q3 and Q4 are turned on, and the static loop 430 is activated. Since the control signal ds is high, the transistor Q8 is off. Thus, in this case, transistor Q8 exerts no influence on node P7.

While certain exemplary embodiments have been described in detail and shown in the accompanying drawings, it is to be understood that such embodiments are merely illustrative of and not restrictive on the broad invention, and that this invention is not to be limited to the specific arrangements and constructions shown and described, since various other modifications may occur to those with ordinary skill in the art.

What is claimed is:

1. A method for refreshing data in a dynamic register having an input terminal and an output terminal, the method comprising:
   (a) coupling a feedback path from the output terminal to the input terminal to create a static loop;
   (b) clocking the dynamic circuit element with complementary clock signals;
   (c) providing a separate control signal to the static loop; and
   (d) activating the static loop via the control signal to refresh the data in the dynamic circuit element;
   wherein operation (a) comprises:
      coupling a first transistor to the output terminal of the dynamic circuit element;
      coupling a second transistor to the input terminal of the dynamic circuit element;
      coupling an input of a loop inverter to the first transistor and an output of the loop inverter to the second transistor; and
      coupling gate terminals of the first and second transistors to the control signal.

2. The method of claim 1 further comprising:
   setting the control signal equal to approximately zero to deactivate the static loop so that the dynamic circuit element operates in a dynamic mode.

3. The method of claim 1 further comprising:
   (1) coupling the gate terminal of the first transistor and the input of the loop inverter to an auxiliary circuit; the auxiliary circuit including an auxiliary transistor and receiving the control signal;
   (2) turning on the auxiliary transistor via the control signal to apply a fixed voltage to the input of the loop inverter when the first transistor is off; and
   (3) turning off the auxiliary transistor via the control signal so that the auxiliary circuit does not affect the voltage at the input of the loon inverter when the first transistor star is on.

4. The method of claim 3 wherein operation (1) comprises:
   coupling the gate terminal of the first transistor to an input of an auxiliary inverter; coupling an output of the auxiliary inverter to a gate terminal of an N-type MOS transistor, the N-type MOS transistor being the auxiliary transistor; and
   coupling a drain terminal of the N-type MOS transistor to the input of the loop inverter; and
   coupling a source terminal of the N-type MOS transistor to ground.

5. The method of claim 3 wherein operation (1) comprises:
   coupling the gate terminal of the first transistor to a gate terminal of a P-type MOS transistor, the P-type MOS transistor being the auxiliary transistor; and coupling a drain terminal of the P-type MOS transistor to the input of the loop inverter; and coupling a source terminal of the P-type MOS transistor to a positive voltage source.

6. A method for refreshing a dynamic register, the dynamic register comprising a first transmission gate and a second transmission gate operating in accordance with complementary clock signals, a first inverter disposed between the first and second transmission gates, a second inverter disposed at the output of the second transmission gate, the first inverter having a first input terminal and a first output terminal, the second inverter having a second input terminal and a second output terminal, the method comprising the operations of:

(a) coupling a feedback path from the first output terminal to the first input terminal to create a first static loop;

(b) coupling a feedback path from the second output terminal to the second input terminal to create a second static loop;

(c) providing a control signal separate from the complementary clock signal to the first and second static loops; and (d) activating the first and second static loops via the control signal to refresh the dynamic register;

wherein operation (a) comprises:

coupling a first transistor to the first output terminal of the first inverter;

coupling a second transistor to the first input terminal of the first inverter;

coupling an input of a first loop inverter to the first transistor and an output of the first loop inverter to the second transistor;

coupling gate terminals of the first and second transistors to the control signal;

coupling a third transistor to the second output terminal of the second inverter;

coupling a fourth transistor to the second input terminal of the second inverter;

coupling an input of a second loop inverter to the third transistor and an output of the second loop inverter to the fourth transistor; and coupling sate terminals of the third and fourth transistors to the control signal.

7. The method of claim 6 further comprising:

setting the control signal equal to approximately zero to deactivate the first and second static loops so that the dynamic register operates in a dynamic mode.

8. The method of claim 6 further comprising:

(1) coupling the gate terminal of the first transistor and the input of the first loop inverter to a first auxiliary circuit, the first auxiliary circuit including a first auxiliary transistor and receiving the control signal;

(2) turning on the first auxiliary transistor via the control signal to apply a fixed voltage to the input of the first loop inverter when the first transistor is off;

(3) turning off the first auxiliary transistor via the control signal so that the first auxiliary circuit does not affect a voltage at the input of the first loop inverter when the first transistor is on;

(4) coupling the gate terminal of the third transistor and the input of the second loop inverter to a second auxiliary circuit, the second auxiliary circuit including a second auxiliary transistor and receiving the control signal;

(5) turning on the second auxiliary transistor via the control signal to apply the fixed voltage to the input of the second loop inverter when the third transistor is off; and (6) turning off the second auxiliary transistor via the control signal so that the second auxiliary circuit does not affect a voltage at the input of the second loop inverter when the third transistor is on.

9. The method of claim 8 wherein operation (1) comprises:

coupling the gate terminal of the first transistor to an input of a first auxiliary inverter;

coupling an output of the first auxiliary inverter to a gate terminal of a first N-type MOS transistor, the first N-type MOS transistor being the first auxiliary transistor;

coupling a drain terminal of the first N-type MOS transistor to the input of the first loop inverter; and coupling a source terminal of the first N-type MOS transistor to ground;

and wherein operation (4) comprises:

coupling the gate terminal of the third transistor to an input of a second auxiliary inverter;

coupling an output of the second auxiliary inverter to a gate terminal of a second N-type MOS transistor, the second N-type MOS transistor being the second auxiliary transistor;

coupling a drain terminal of the second N-type MOS transistor to the input to the second loop inverter; and coupling a source terminal of the second N-type MOS transistor to ground.

10. The method of claim 8 wherein operation (1) comprises:

coupling the gate terminal of the first transistor to a gate terminal of a first P-type MOS transistor, the first P-type MOS transistor being the first auxiliary transistor;

coupling a drain terminal of the first P-type MOS transistor to the input of the first loop inverter;

coupling a source terminal of the first P-type MOS transistor to a positive voltage source; and wherein operation (4) comprises:

coupling the gate terminal of the third transistor to a gate terminal of a second P-type MOS transistor, the second P-type MOS transistor being the second auxiliary transistor;

coupling a drain terminal of the second P-type MOS transistor to the input of the second loop inverter; and coupling a source terminal of the second P-type MOS transistor to a positive voltage source.

11. A system for refreshing a dynamic register, the dynamic register comprising a first transmission gate and a second transmission gate operating in accordance with complementary clock signals, a first inverter disposed between the first and second transmission gates, a second inverter disposed at the output of the second transmission gate, the first inverter having a first input terminal and a first output terminal, the second inverter having a second input terminal and a second output terminal, the system comprising:

(a) a first static loop coupled to the first inverter as a feedback path from the first output terminal to the first input terminal, the first static loop receiving a control signal, the first static loop being activated or deactivated by the control signal, the first static loop refreshing the first inverter when activated; and (b) a second static loop coupled to the second inverter as a feedback path from the second output terminal to the second input terminal, the second static loop receiving a control signal, the second static loop being activated or deactivated by the control signal, the second static loop refreshing the second inverter when activated;

wherein the first static loop comprises:
a first transistor coupled to the first output terminal of the first inverter, a gate terminal of the first transistor being coupled to the control signal;
a second transistor coupled to the first input terminal of the first inverter, a gate terminal of the second transistor being coupled to the control signal; and
a first loop inverter having an input coupled to the first transistor and an output coupled to the second transistor;

and wherein the second static loop comprises:
a third transistor coupled to the second output terminal of the second inverter, a gate terminal of the third transistor being coupled to the control signal;
a fourth transistor coupled to the second input terminal of the second inverter, a gate terminal of the fourth transistor being coupled to the control signal; and
a second loop inverter having an input coupled to the third transistor and an output coupled to the fourth transistor.

12. The system of claim 11 wherein the first and second static loops are deactivated when the control signal is approximately equal to zero.

13. The system of claim 11 further comprising:
(1) a first auxiliary circuit coupled to the gate terminal of the first transistor and to the input of the first loop inverter, the first auxiliary circuit including a first auxiliary transistor and receiving the control signal, the first auxiliary transistor being turned on via the control signal to apply a fixed voltage to the input of the first loop inverter when the first transistor is off, the first auxiliary transistor being turned off via the control signal so that the first auxiliary circuit does not affect a voltage at the input of the first loop inverter when the first transistor is on; and
(2) a second auxiliary circuit coupled to the gate terminal of the third transistor and to the input of the second loop inverter, the second auxiliary circuit including a second auxiliary transistor and receiving the control signal, the second auxiliary transistor being turned on via the control signal to apply a fixed voltage to the input of the second loop inverter when the third transistor is off, the second auxiliary transistor being turned off via the control signal so that the second auxiliary circuit does not affect a voltage at the input of the second loop inverter when the third transistor is on.

14. The system of claim 13 wherein the first auxiliary circuit comprises:
a first auxiliary inverter having an input coupled to the gate terminal of the first transistor; and
a first N-type MOS transistor having a gate terminal coupled to an output of the first auxiliary inverter, a drain terminal coupled to the input of the first loop inverter and a source terminal coupled to ground, the first N-type MOS transistor being the first auxiliary transistor;

and wherein the second auxiliary circuit comprises:
a second auxiliary inverter having an input coupled to the gate terminal of the third transistor; and
a second N-type MOS transistor having a gate terminal coupled to an output of the second auxiliary inverter, a drain terminal coupled to the input of the second loop inverter and a source terminal coupled to ground, the second N-type MOS transistor being the second auxiliary transistor.

15. The system of claim 13 wherein the first auxiliary circuit comprises:
a first P-type MOS transistor having a gate terminal coupled to the gate terminal of the first transistor, a drain terminal coupled to the input of the first loop inverter and a source terminal coupled to a positive voltage source, the first P-type MOS transistor being the first auxiliary transistor;

and wherein the second auxiliary circuit comprises:
a second P-type MOS transistor having a gate terminal coupled to the gate terminal of the third transistor, a drain terminal coupled to the input of the second loop inverter and a source terminal coupled to a positive voltage source, the second P-type MOS transistor being the second auxiliary transistor.

16. A system for refreshing a dynamic register included in a gigabit transceiver chip, the dynamic register comprising a first transmission gate and a second transmission gate operating in accordance with complementary clock signals, a first inverter disposed between the first and second transmission gates, a second inverter disposed at the output of the second transmission gate, the first inverter having a first input terminal and a first output terminal, the second inverter having a second input terminal and a second output terminal, the system comprising:
(a) a first static loop coupled to the first inverter as a feedback path from the first output terminal to the first input terminal, the first static loop receiving a control signal, the first static loop being activated or deactivated by the control signal, the first static loop refreshing the first inverter when activated; and
(b) a second static loop coupled to the second inverter as a feedback path from the second output terminal to the second input terminal, the second static loop receiving a control signal, the second static loop being activated or deactivated by the control signal, the second static loot refreshing the second inverter when activated.

17. A method for refreshing data in a system having a dynamic circuit element, the dynamic circuit element having an input terminal and an output terminal, and a static loop that forms feedback path from the output terminal to the input terminal, the method comprising:
(a) coupling the static loop to the dynamic circuit element;
(b) clocking the dynamic circuit element using clocking signals; and
(c) refreshing the dynamic circuit element via the static loop using a control signal;
wherein operation (a) comprises:
coupling a first transistor to the output terminal of the dynamic circuit element;
coupling a second transistor to the input terminal of the dynamic circuit element;
coupling an input of a loop inverter to the first transistor and an output of the loop inverter to the second transistor; and
coupling gate terminals of the first and second transistors to the control signal.

18. The method of claim 17 wherein the dynamic circuit element comprises an inverter.

19. The method of claim 17 wherein refreshing the dynamic circuit element comprises activating the static loop via the control signal.

20. The method of claim 19 further comprising:
setting the control signal equal to approximately zero to deactivate the static loop.

21. The method of claim 17 further comprising:
(1) coupling the gate terminal of the first transistor and the input of the loop inverter to an auxiliary circuit, the auxiliary circuit including an auxiliary transistor and receiving the control signal;
(2) turning on the auxiliary transistor via the control signal to apply a fixed voltage to the input of the loop inverter when the first transistor is off; and
(3) turning off the auxiliary transistor via the control signal so that the auxiliary circuit does not affect the voltage at the input of the loop inverter when the first transistor is on.

22. The method of claim 21 wherein operation (1) comprises:
coupling the gate terminal of the first transistor to an input of an auxiliary inverter; coupling an output of the auxiliary inverter to a gate terminal of an N-type MOS transistor, the N-type MOS transistor being the auxiliary transistor; and coupling a drain terminal of the N-type MOS transistor to the input of the loop inverter; and coupling a source terminal of the N-type MOS transistor to ground.

23. The method of claim 21 wherein operation (1) comprises:
coupling the gate terminal of the first transistor to a gate terminal of a P-type MOS transistor, the P-type MOS transistor being the auxiliary transistor; and coupling a drain terminal of the P-type MOS transistor to the input of the loop inverter; and coupling a source terminal of the P-type MOS transistor to a positive voltage source.

\* \* \* \* \*